US010989221B2

(12) United States Patent
Chen et al.

(10) Patent No.: US 10,989,221 B2
(45) Date of Patent: Apr. 27, 2021

(54) COOLING SYSTEM FOR STREAMLINED AIRFLOW

(71) Applicant: Quanta Computer Inc., Taoyuan (TW)

(72) Inventors: Chao-Jung Chen, Taoyuan (TW); Yu-Nien Huang, Taoyuan (TW); Ching-Yu Chen, Taoyuan (TW); Tsung-Ta Li, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 435 days.

(21) Appl. No.: 15/197,507

(22) Filed: Jun. 29, 2016

(65) Prior Publication Data

US 2018/0003192 A1 Jan. 4, 2018

(51) Int. Cl.
F04D 29/54 (2006.01)
H05K 7/20 (2006.01)
F04D 19/00 (2006.01)
F04D 29/32 (2006.01)

(52) U.S. Cl.
CPC ......... F04D 29/542 (2013.01); F04D 19/002 (2013.01); F04D 29/325 (2013.01); H05K 7/20727 (2013.01); H05K 7/20736 (2013.01)

(58) Field of Classification Search
CPC ...... F04D 29/325; F04D 29/52; F04D 29/522; F04D 29/54; F04D 29/541; F04D 29/542; F04D 29/544; F04D 19/002; F04D 25/08; H05K 7/20136; H05K 7/20145; H05K 7/20172; H05K 7/20727; H05K 7/20736
See application file for complete search history.

(56) References Cited

U.S. PATENT DOCUMENTS

| 4,221,546 A * | 9/1980 | Papst ................... F04D 29/545 |
| | | 415/207 |
| 4,734,015 A * | 3/1988 | Wrobel ................. F04D 19/002 |
| | | 415/207 |
| 5,289,068 A | 2/1994 | Veronesi et al. |
| 6,024,536 A | 2/2000 | Tsubakida et al. |
| 8,197,198 B2 | 6/2012 | Miyabara et al. |
| 9,078,375 B1 | 7/2015 | Bannon et al. |

(Continued)

FOREIGN PATENT DOCUMENTS

| CN | 201574954 U | 9/2010 |
| CN | 102242737 A | 11/2011 |

(Continued)

OTHER PUBLICATIONS

Taiwanese Office Action for Application No. 105126955, dated Jan. 23, 2017, w/ First Office Action Summary.

(Continued)

Primary Examiner — Christopher Verdier
Assistant Examiner — Elton K Wong
(74) Attorney, Agent, or Firm — Nixon Peabody LLP

(57) ABSTRACT

A cooling system includes a fan and a system component. The fan includes a plurality of fan blades and configured to rotate in a fan direction. The system component is located downstream of the fan, and includes a cutout for passing of airflow from the fan, and a bridge spanning the cutout. The bridge includes a center section and at least one arm section extending from the center section to an edge of the cutout along a curved path offset towards the fan direction.

16 Claims, 11 Drawing Sheets

(56) References Cited

U.S. PATENT DOCUMENTS

| | | |
|---|---|---|
| 9,241,427 B1 | 1/2016 | Stevens et al. |
| 2003/0026691 A1 | 2/2003 | Huang et al. |
| 2003/0214781 A1 | 11/2003 | Kolb et al. |
| 2006/0093476 A1* | 5/2006 | Stanley .................. F04D 29/544 415/191 |
| 2007/0081891 A1* | 4/2007 | Oh ....................... F04D 25/0613 415/151 |
| 2008/0107524 A1* | 5/2008 | Chang ................... F04D 25/082 415/220 |
| 2009/0257869 A1* | 10/2009 | Li ....................... F04D 25/0613 415/220 |
| 2009/0290984 A1* | 11/2009 | Miyabara ............... F04D 19/007 416/198 R |
| 2013/0039751 A1* | 2/2013 | Tseng .................... F04D 29/703 415/206 |
| 2013/0251559 A1* | 9/2013 | Taroda .................. F04D 19/002 417/410.1 |
| 2013/0265713 A1 | 10/2013 | Crane et al. |
| 2014/0271289 A1* | 9/2014 | Thrush .................. F04D 29/563 417/423.14 |
| 2014/0369001 A1 | 12/2014 | Miller et al. |
| 2015/0176605 A1* | 6/2015 | Pegues .................... B60K 11/02 415/208.1 |

FOREIGN PATENT DOCUMENTS

| | | |
|---|---|---|
| CN | 203604216 U | 5/2014 |
| JP | 1971000353 A | 8/1971 |
| JP | 1990040317 Y | 10/1990 |
| JP | 1998205497 A | 8/1998 |
| JP | 2000201464 A | 7/2000 |
| JP | 2003056498 A | 2/2003 |
| JP | 2010007657 A | 1/2010 |
| JP | 2010043575 A | 2/2010 |
| JP | 5244620 B2 | 4/2013 |
| TW | M248222 U | 10/2004 |
| TW | M323762 U | 12/2007 |
| WO | 2001011241 A1 | 2/2001 |

OTHER PUBLICATIONS

Taiwanese Search Report for Application No. 105126955, dated Jan. 23, 2017.
Taiwanese Office Action for Application No. 105126955, dated Sep. 19, 2017, w/ Second Office Action Summary.
Taiwanese Search Report for Application No. 105126955, dated Sep. 19, 2017.
Extended European Search Report for EP Application No. 17172338.0, dated Nov. 7, 2017.
JP Office Action for Application No. 2017-122555, dated May 29, 2018, w/ First Office Action Summary.
JP Office Action for Application No. 2017-122555, dated Dec. 18, 2018, w/ Second Office Action Summary.
JP Office Action for Application No. 2017-122555, dated Aug. 13, 2019, w/ Third Office Action Summary.
Communication Pursuant to Article 94(3) in European Application No. 17172338.0 dated Feb. 17, 2020.

* cited by examiner

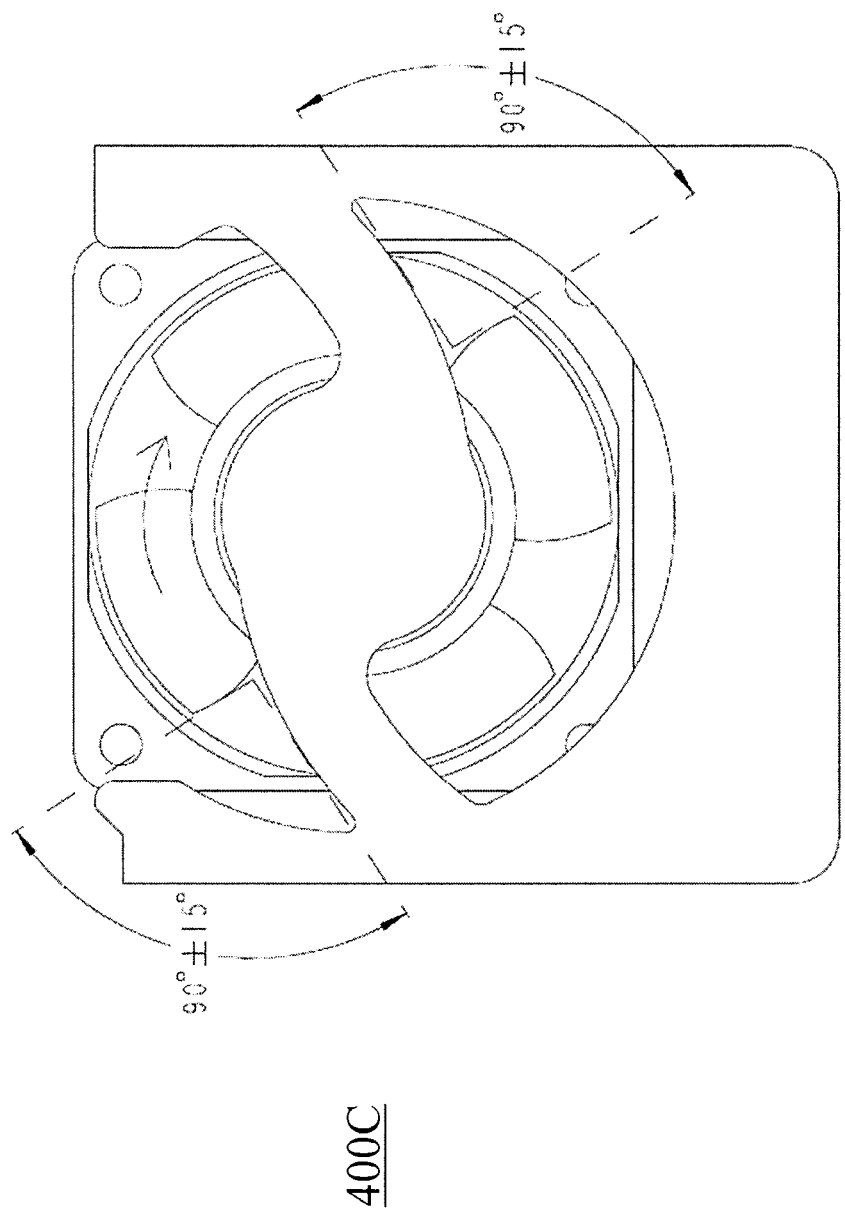

COOLING SYSTEM FOR STREAMLINED AIRFLOW

FIELD

This application relates to cooling systems, and more particularly to a cooling system with improved airflow.

BACKGROUND

Computer server systems in modern data centers are commonly mounted in specific configurations on server racks for which a number of computing modules, such as server trays, server chassis, server sleds, server blades, etc., are positioned and stacked relative on top of each other within the server racks. Rack mounted systems allow for vertical arrangement of the computing modules to use space efficiently. Generally, each computing module can slide into and out of the server rack, and various cables such as input/output (I/O) cables, network cables, power cables, etc., connect to the computing modules at the front or rear of the rack. Each computing module contains one or more computer servers or may hold one or more computer server components. For example computing modules includes hardware circuitry for processing, storage, network controllers, disk drives, cable ports, power supplies, etc.

In many configurations, fans in rack mounted systems are configured to move air from the front of a chassis enclosure, through the computing modules and other components, and exhaust the air out the back of the chassis enclosure. Many electronic components generate heat when operating and because of the high density of the computing modules in the chassis, so a significant amount of heat is generated by the computing modules. Therefore, the flow of air through the chassis enclosure is essential for preventing overheating of the computing modules. Accordingly, there is a significant interest in improving fan performance for computer server systems and other types of computing devices.

SUMMARY

The following presents a simplified summary of one or more embodiments in order to provide a basic understanding of present technology. This summary is not an extensive overview of all contemplated embodiments of the present technology, and is intended to neither identify key or critical elements of all examples nor delineate the scope of any or all aspects of the present technology. Its sole purpose is to present some concepts of one or more examples in a simplified form as a prelude to the more detailed description that is presented later.

In some implementations, a system includes a fan and a system component. The fan being an axial-flow fan which includes a plurality of fan blades and is configured to rotate in a fan direction to draw air from an airflow inlet to an axially aligned airflow outlet. The system component is located downstream of the fan, and includes a cutout for passing of airflow from the fan, and a bridge spanning the cutout. The bridge includes a center section and at least one arm section extending from the center section to an edge of the cutout along a curved path offset towards the fan direction.

In some implementations, the system further includes a spinner fan blade fairing that extends from the center section of the system component. In some implementations, the system further includes a reverse blade fairing extends from each of the at least one arm section.

In some implementations, each of the plurality of fan blades includes a leading fan edge facing towards the fan direction and a trailing fan edge facing against the fan direction, wherein each of the at least one arm section comprises a leading arm edge facing the fan direction and a trailing arm edge facing against the fan direction. In some implementations, the leading arm edge of each of the at least one arm section is shaped such that, during rotation of the fan in the fan direction, a first tangent line of the leading arm edge and a second tangent line of the trailing fan edge of any of the plurality of fan blades intersect at an angle that is between 75 degrees and 105 degrees for a majority of rotational positions of the fan.

In some implementations, the leading arm edge follows a convex path from the center section to the edge of the cutout. In some implementations, the trailing arm edge follows a concave path from the center section to the edge of the cutout. In some implementations, the leading arm edge and trailing arm edge have an approximately equivalent shape.

In some implementations, the majority of rotation positions of the fan include at least 75 percent of rotational positions of the fan. In some implementations, the angle is approximately 90 degrees. In some implementations, the angle is between 83 degrees and 97 degrees.

In some implementations, the center section is circular shaped. In some implementations, each of the at least one arm section is equivalent shape. In some implementations, the at least one arm section comprises a single arm section. In some implementations, the at least one arm section includes two arm sections that extend from opposite sides of the center section. In some implementations, the at least one arm section includes three or more arm sections.

BRIEF DESCRIPTION OF THE DRAWINGS

These and other sample aspects of the present technology will be described in the detailed description and the appended claims that follow, and in the accompanying drawings, wherein:

FIGS. 4A-D illustrates front views of example cooling systems;

DETAILED DESCRIPTION

The subject disclosure provides cooling systems for improved airflow. Various aspects of the present technology are described with reference to the drawings. In the following description, for purposes of explanation, numerous specific details are set forth in order to provide a thorough understanding of one or more aspects. It is evident, however, that the present technology can be practiced without these specific details. In other instances, well-known structures and devices are shown in block diagram form in order to facilitate describing these aspects.

Various server chassis designs are used to accommodate a large number of hard disk drives, motherboards, and fans. The various server chassis designs often places particular computer modules in different positions in the server chassis to improve airflow and cooling. A component that lies downstream of a fan will impede airflow. The disclosure provides a cooling system that lessens the impedance of airflow downstream of fans. The cooling system can be applied in a computer system, such as a server chassis, or in other devices.

Figure 1:
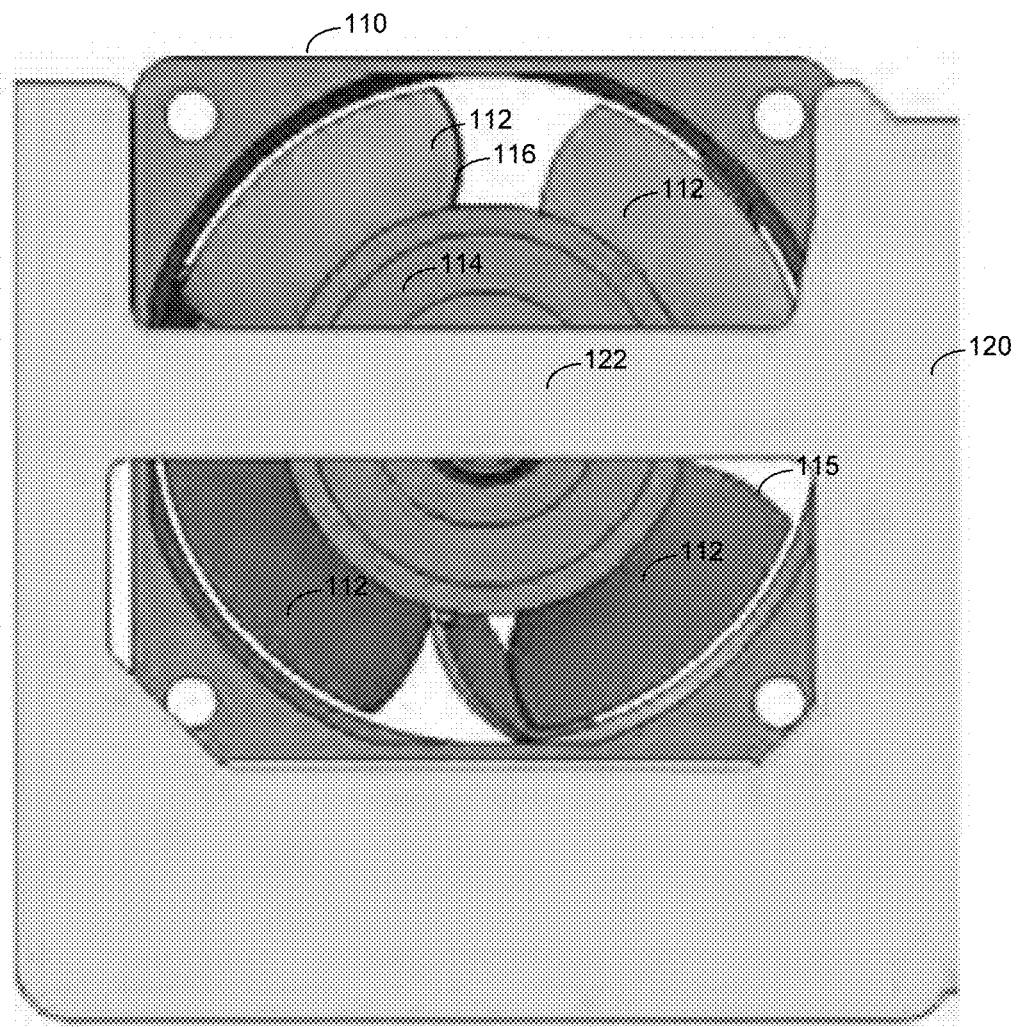
FIG. 1 illustrates a front view of an example cooling system in the prior art.

FIG. 1 illustrates a front view of an example cooling system 100 in the prior art. The cooling system 100 includes a fan 110 and a system component 120.

The fan 110 is configured to move air towards and through the system component 120. For example the fan 110 can be a standard fan, which is commonly square shaped and one of 80 mm, 92 mm, 320 mm, 340 mm, 200 mm, or 230 mm in width and length. Typically, when larger fans are used, few fans and less rotation speed are needed to produce an equivalent amount of airflow as compared to using smaller fans.

The fan 110 includes a plurality of fan blades 112 (e.g., four fan blades 112 are shown). The fan 110 includes a center fan section 114 by which each of the plurality of fan blades 112 are attached. When in operation, the center fan section 114 and the fan blades 112 rotate either clockwise or counter-clockwise. The fan 110 can be powered by an electric motor (not shown) connected to the center section 114. The fan blades 112 can be implemented in a wide variety of shapes and sizes. For example, each of the fan blades 112 may have a flat planar shape or a curved planar shape. However, the present disclosure contemplates that any size or shape can be used for fan blades 112.

Each of the fan blades 112 are attached to the center fan section 114 at an angle that allows the fan blade to move air towards the system component 120 when the fan 110 is rotated during operation.

The system component 120 is located downstream of the fan 110. The system component 120 is any object that acts as an obstacle to airflow from the fan 110. For example, the system component 120 can be a printed circuit board (PCB) that provides connections between various components of a server chassis. The system component 120 includes a cutout to allow air to flow past the system component 120 from the fan 110. The system component 120 includes a bridge 122 that spans the cutout. The bridge 122 specifically acts as an obstacle to the airflow from the fan 110.

Figure 2:
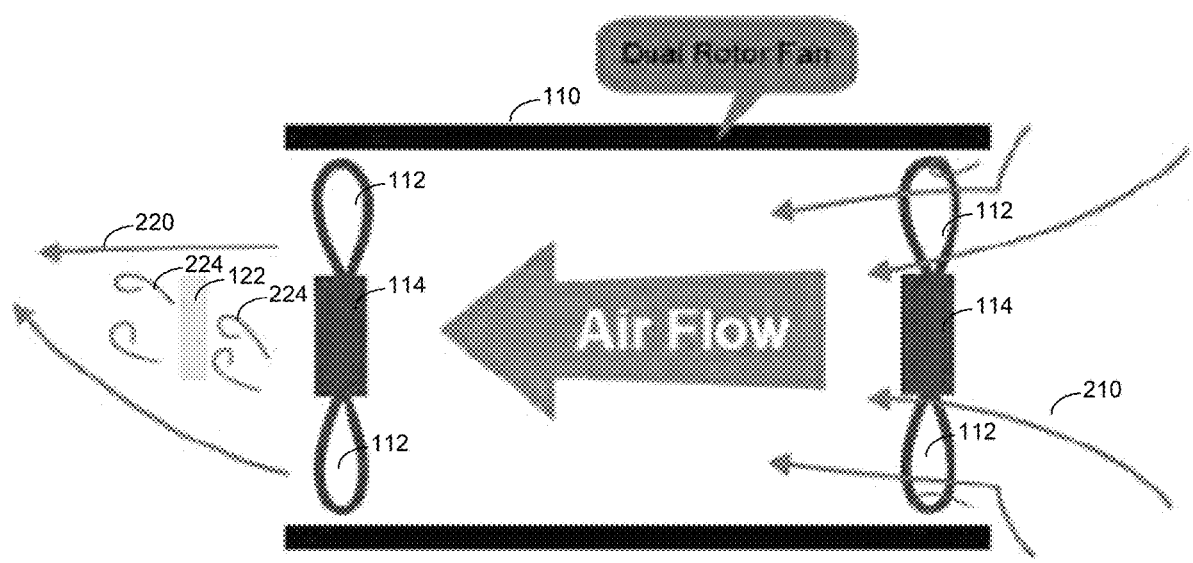
FIG. 2 illustrates a side view of paths of airflow in the example cooling system of FIG. 1 in the prior art.

FIG. 2 illustrates a side view of paths of airflow in the example cooling system 100 of FIG. 1 in the prior art. The cooling system 100 includes a fan 110 and a system component 120.

The fan 110 in the example cooling system 100 shown includes two rotors that are located in-line with each other, but similar principles apply to single rotor fans. Each rotor includes a plurality of fan blades 112 and a center fan section 114. The fan 110 draws airflow in 210 and through 220 the system component 120

The system component 120 is located downstream of the fan 110. The system component 120 includes a bridge 122 that spans the cutout. The bridge 122 specifically acts as an obstacle to the airflow from the fan 110. The bridge 122 causes turbulent airflow on both sides of the bridge 122 that reduces total airflow 220 through the system component 120.

Figure 3:
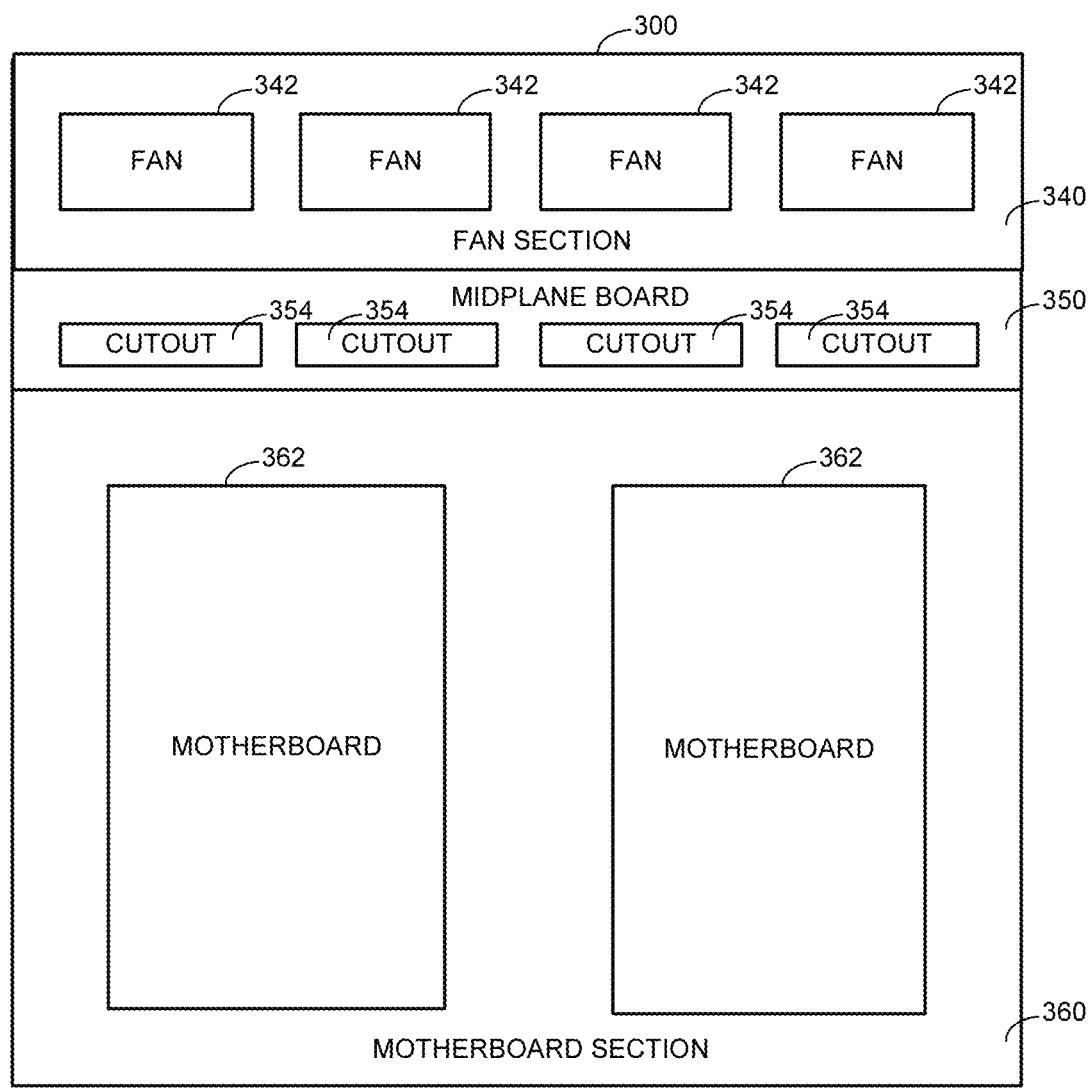
FIG. 3 illustrates a front view of an example cooling system in a server chassis in the prior art.

FIG. 3 illustrates a front view of an example cooling system in a server chassis 300 in the prior art. In some implementations, the server system 300 is a part of a larger rack system. The example server chassis 300 includes a fan section 340, a motherboard section 360, and a midplane board 350.

The fan section 340 includes one or more fans 342 that move air through the server system 300 from the fan section 340 in the direction towards the motherboard section 360. The fans 342 cause air to be pulled through the midplane board 350 to the motherboard section 360.

The motherboard section 360 includes one or more motherboards 362. Each motherboard 362 (also known as mainboard, system board, planar board, or logic board) is a main printed circuit board (PCB) found in computers and other expandable systems. The motherboard 362 holds and allows communication between many electronic components (not shown) of a computer system, such as the central processing unit (CPU) and memory, and provides connectors for other peripherals.

The midplane board 350 is located between the fan section 340 and the motherboard section. The midplane board 350 provides connections to the one or more motherboards 362. In some aspects, the midplane board 350 is arranged parallel to the front panel 310. In some aspects, the midplane board 350 is a printed circuit board (PCB) that includes hot pluggable connectors that allow insertion of each of the motherboards 362. The midplane board 350 connects to the backplane board 330 to allow communication between the motherboards 362 and the storage devices 322 and to provide the motherboards 362 with power. The midplane board 350 includes at least one cutout 354 for allowing air to flow from the fan section 340 to the motherboard section 360. The each cutout 354 of midplane board 350 includes a bridge (not shown). The midplane board 350 is an example of the system component 122 that obstructs airflow as described in FIGS. 1-2.

However, while components can be arranged in a server chassis to improve airflow, the typical cutout shapes implemented in a server chassis introduce turbulence and impede efficient airflow. Therefore, the present disclosure contemplates utilizing particular shapes of the cutouts and bridges that are configured to increase airflow from each of the fans into a server chassis. This is illustrated below with respect to FIGS. 4A-4D.

FIGS. 4A-D illustrates front views of example cooling systems. The cooling system 400A includes a fan 410 and a system component 420.

The fan 410 is configured to move air towards and through the system component 420. For example the fan 410 can be a standard fan, which is commonly square shaped and one of 80 mm, 92 mm, 320 mm, 340 mm, 200 mm, or 230 mm in width and length. Typically, when larger fans are used, fewer fans and lower rotational speeds are needed to produce an equivalent amount of airflow as compared to using smaller fans.

Figure 4A:
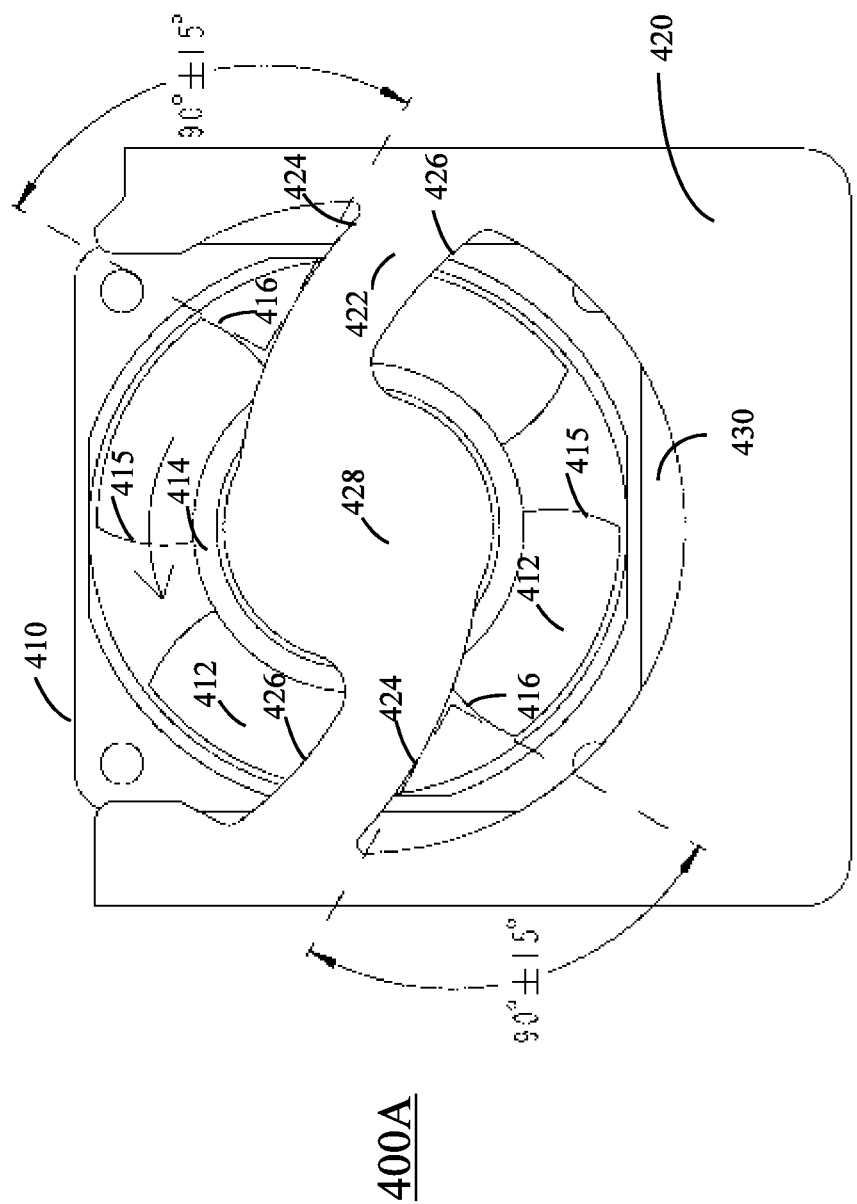

The fan 410 includes a plurality of fan blades 412 (e.g., four fan blades 412 are shown). The fan 410 includes a center fan section 414 to which each of the plurality of fan blades 412 are attached. When in operation, the fan 410 rotates the center section 414 and the fan blades 412 in a fan direction of either a clockwise or counter-clockwise direction. For example, the fan direction can be counter-clockwise as shown in FIG. 4A.

The fan 410 is powered by an electric motor (not shown) connected to the center fan section 414. The fan blades 412 are available in a wide variety of shapes and sizes. For example, each of the fan blades 412 may have a flat planar shape or a curved planar shape. However, the present disclosure contemplates that other shapes can be used as well.

Each fan blade 412 includes a leading fan edge 415 facing towards the fan direction and a trailing fan edge 416 facing against the fan direction. Each of the fan blades 412 are attached to the center fan section 414 at a blade angle (i.e., blade angle in relation to an axle of rotation of the fan) that allows the fan blade to move air towards the system component 420 when the fan 410 is rotated during operation.

The system component 420 is located downstream of the fan 410. The system component 420 is any object that acts as an obstacle to airflow from the fan 410. For example, the system component 420 can be a printed circuit board (PCB) that provides connections between various components of a server chassis. The system component 420 includes a cutout to allow air to flow past the system component 420 from the fan 410.

The system component 420 includes a bridge 422 that spans the cutout. The bridge 422 specifically acts as an obstacle to the airflow from the fan 410. The bridge 422 includes a center section 428 and at least one arm section 422 (two arm sections are shown). In some implementations, there may be three or more arm sections 422.

In some implementations, the center section 428 is circular shaped. The center section 428 may be aligned with the center fan section 414.

Each arm section 422 extends in a curved path from the center section 428 to an edge 430 of the cutout. Each arm section 422 is connected to the center section 428 and offset towards the fan direction. That is, for the counter-clockwise fan direction shown, each arm section 422 is offset counter-clockwise from the center section 428 as shown in FIG. 4A.

Each arm section includes a leading arm edge 424 and a trailing arm edge 426. The leading arm edge 424 faces the fan direction and the trailing arm edge 426 faces against the fan direction.

In some implementations, the leading arm edge 424 follows a convex path from the center section 428 to the edge 430 of the cutout. In some implementations, the trailing arm edge 426 follows a concave path from the center section 428 to the edge 430 of the cutout. In some implementations, wherein the leading arm edge 424 and trailing arm edge 426 have an approximately equivalent shape.

In some implementations, the leading arm edge 424 of each arm section 422 is shaped such that, during rotation of the fan 410 in the fan direction, a first tangent line of the leading arm edge 424 and a second tangent line of the trailing fan edge 416 of any of the fan blades 412 intersect at an angle 430 that is approximately 90 degrees (e.g., between 75 degrees and 105 degrees) for a majority of rotational positions of the fan 410, as shown in FIG. 4A. That is, in the front view show in FIG. 4A, as each fan blade 412 rotate, when each of the trailing fan edge 416 passes over one of the leading arm edges 424, the angle 430 of intersection between the two edges 416, 424 is approximately perpendicular. However, during a minority of rotational positions of the fan 410, the angle 430 does not need to be approximately perpendicular.

In some implementations, the majority of rotational positions of the fan 410 include at least 75 percent of rotational positions of the fan. In some implementations, the angle 430 is between 83 degrees and 97 degrees.

Figure 4B:
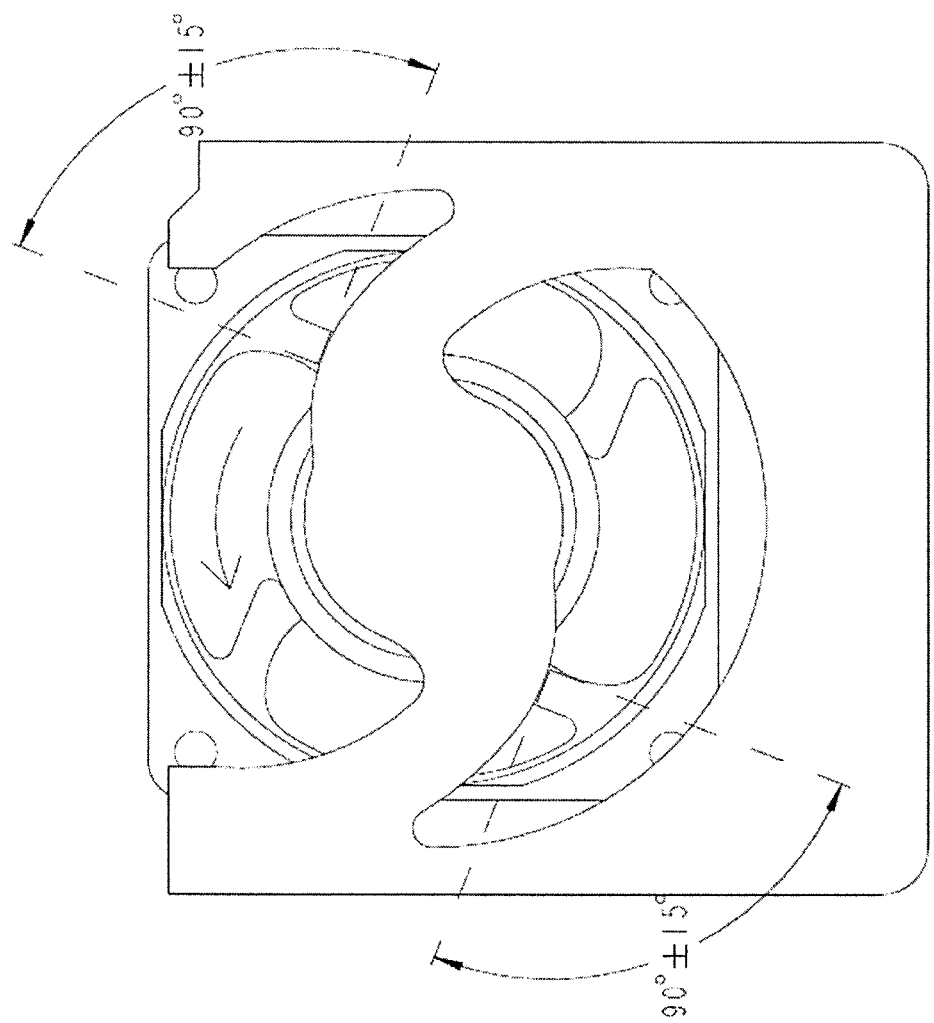
Figure 4D:
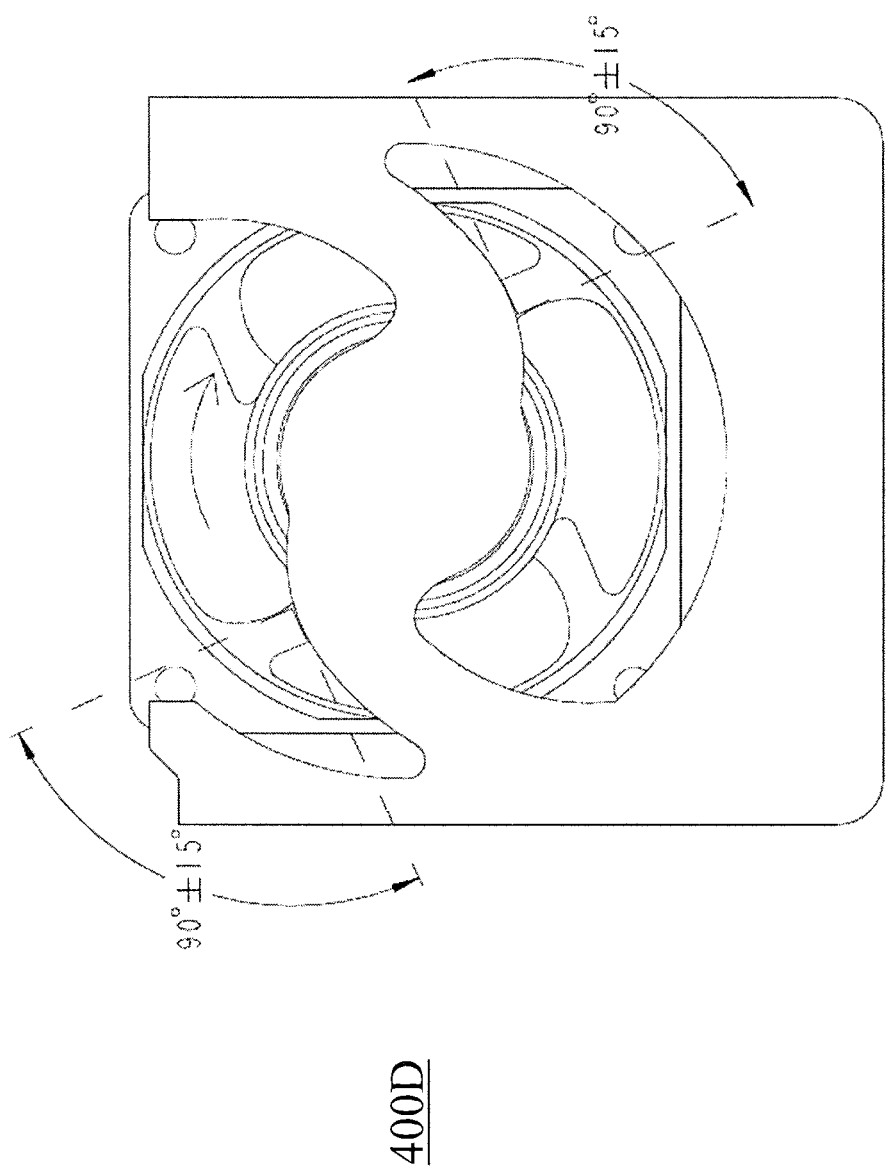
Figure 5A:
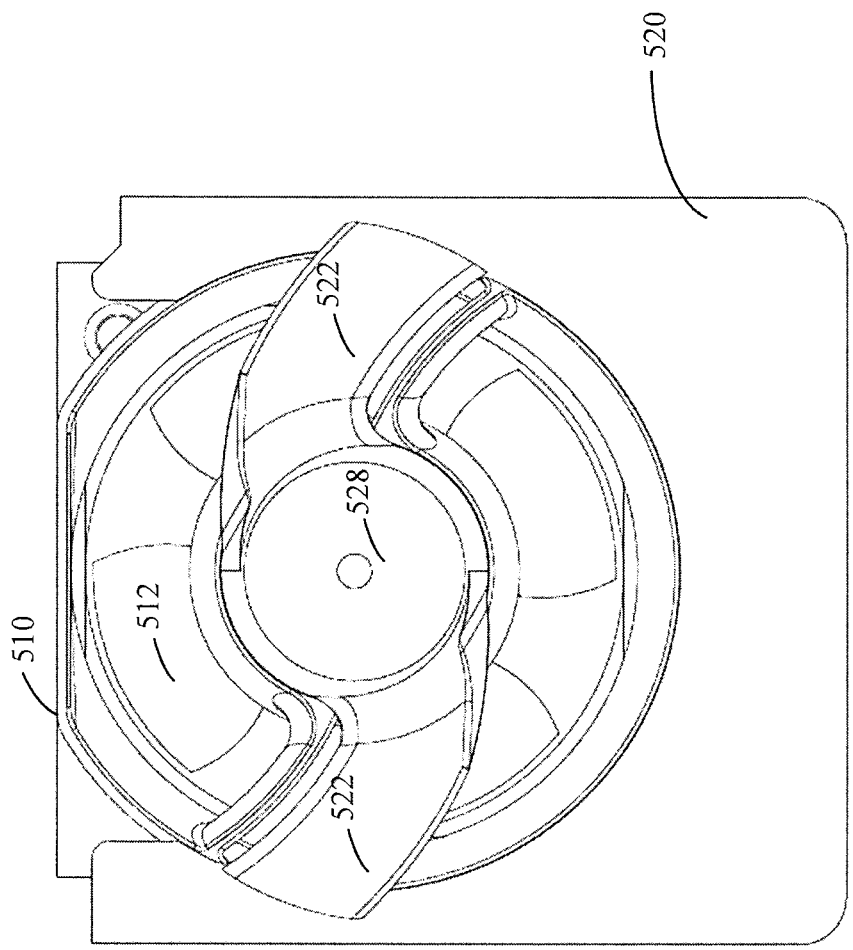
FIGS. 5A-B illustrates a front and side view of a first example cooling system with a spinner fairing and a reverse blade fairing.
Figure 5B:
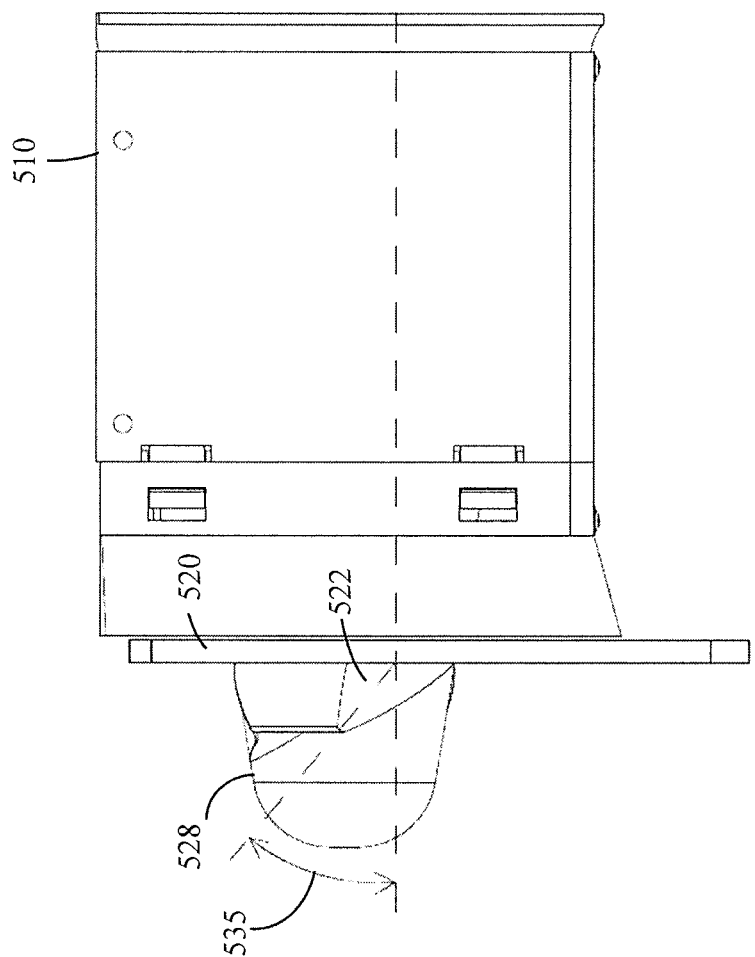

FIGS. 4B-D show variations cooling systems with fan blades 412 and arm sections 422 shapes as described in reference to the cooling system 400A of FIG. 4A. In some implementations, to further improve airflow, fairings can be used. This is illustrated in FIGS. 5A-B FIGS. 5A-B illustrates a front and side view of a first example cooling system 500 with a spinner fairing 528 and a reverse blade fairing 522. The cooling system 500 is a variation of the cooling system 400A shown in FIG. 4A with the addition of the spinner fairing 528 and the reverse blade fairing 522 and includes all the features of the cooling system 400A.

The spinner fairing 528 is a part of or an addition to the center section of the system component 520. In some implementations, the spinner fairing 528 is cone shaped. In some implementations, the spinner fairing 528 has a shape of a tear drop tail. It is understood that the spinner fairing 528 can be of any shape that decreases turbulent airflow downstream of the center section of the system component 520.

Each reverse blade fairing 522 is a part of or an addition to each arm section of the system component 520. In some implementations, each reverse blade fairing 522 622 has a cross-section shaped as a curved wedge.

Each of the fan blades 512 are attached to the center fan section at a blade angle (i.e., blade angle in relation to an axle of rotation of the fan) that allows the fan blade to move air towards the system component 520 when the fan 510 is rotated (e.g., clockwise as shown in FIG. 5A) during operation. Each reverse blade fairing 522 is attached to the center section of the system component 520 at a fairing angle 535 approximately reverse of the blade angle.

Figure 6A:
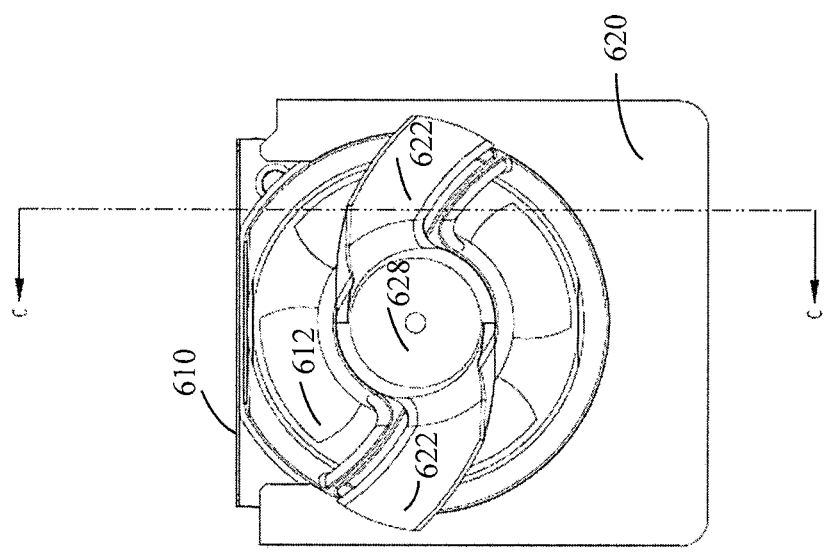
FIGS. 6A-B illustrates a front and side view of a second example cooling system with a spinner fairing and a reverse blade fairing.
Figure 6B:
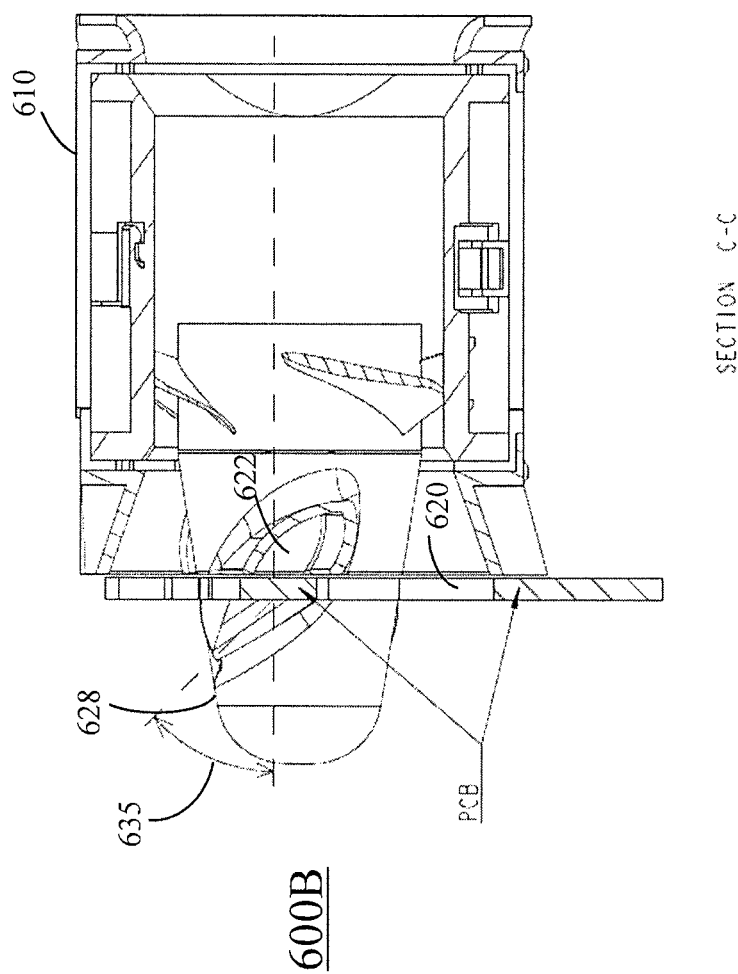

FIGS. 6A-B illustrates a front and side view of a second example cooling system with a spinner fairing and a reverse blade fairing. The cooling system 600 is a variation of the cooling system 500 shown in FIGS. 5A-B with the spinner fairing 628 extending both from the center section of the system component 620 both towards and away from the fan 610 and with the reverse blade fairing 622 extending from the arm section of the system component 620 both towards and away from the fan 610.

The spinner fairing 628 is a part of or an addition to the center section of the system component 620. In some implementations, the spinner fairing 628 is cone shaped. In some implementations, the spinner fairing has a shape of a tear drop tail. It is understood that the spinner fairing can be of any shape that decreases turbulent airflow downstream of the center section of the system component 620. In some implementations, a part of the spinner fairing extends from the center section of the system component 620 towards the center fan section of the fan 610.

Each reverse blade fairing 622 is a part of or an addition to each arm section of the system component 620. In some implementations, each reverse blade fairing 622 has a cross-section shaped as a double convex.

Each of the fan blades 612 are attached to the center fan section at a blade angle (i.e., blade angle in relation to an axle of rotation of the fan) that allows the fan blade to move air towards the system component 620 when the fan 610 is rotated (e.g., clockwise as shown in FIG. 6A) during operation. Each reverse blade fairing 622 is attached to the center section of the system component 620 at a fairing angle 635 approximately reverse of the blade angle.

The previous description of the disclosure is provided to enable any person skilled in the art to make or use the disclosure. Various modifications to the disclosure will be readily apparent to those skilled in the art, and the generic principles defined herein can be applied to other variations without departing from the scope of the disclosure. Thus, the disclosure is not intended to be limited to the examples and designs described herein, but is to be accorded the widest scope consistent with the principles and novel features disclosed herein.

The invention claimed is:

1. A system for providing streamlined airflow in a server chassis, comprising:
   a fan comprising a plurality of fan blades and configured to rotate in a fan direction, each of the fan blades having a leading fan edge and a trailing fan edge, the leading fan edge extending from a fan center portion of the fan to a fan outer edge, the trailing fan edge opposing the leading fan edge and extending from the fan center portion to the fan outer edge, wherein the fan is an axial-flow fan comprising an airflow inlet that is axially aligned with an airflow outlet; and
   a system component in the form of a printed circuit board (PCB) that provides connections between various components of the server chassis, the system component being located downstream of the fan and including a cutout for passing of airflow from the fan, the cutout having a cutout edge, the system component further including a bridge spanning the cutout, the bridge having
      a bridge center section;
      at least one arm section extending from the bridge center section to a cutout outer edge along a curved path offset towards the fan direction, the at least one arm section having a leading arm edge and a trailing arm edge, the leading arm edge extending from the bridge center section to the cutout outer edge, the trailing arm edge extending from the bridge center section to the cutout outer edge; and
      a spinner fairing configured to decrease turbulent airflow downstream of the bridge center section;
   wherein the leading arm edge follows a first convex path that curves towards the trailing fan edge, the trailing fan edge facing against the fan direction and following a second convex path that curves away from the leading arm edge, an angular relationship between the leading arm edge and the trailing fan edge being defined by an angle of intersection between a first tangent line and a second tangent line, the angle of intersection being in a range between 75 degrees and 105 degrees for a majority of rotational positions of the fan, the first tangent line extending along the leading arm edge and touching the leading arm edge at a first point on the leading arm edge, the second tangent line extending along the trailing fan edge and touching the trailing fan edge at a second point on the trailing fan edge, the trailing fan edge extending from a radially inner end to a radially outer end, the second point being a point on the second convex path relative to the trailing fan edge in a two-dimensional plane in which the second convex path extends, the first point being a point on the first convex path relative to the leading arm edge in the two-dimensional plane.

2. The system of claim 1, wherein the spinner fairing extends from the bridge center section.

3. The system of claim 1, further comprising a reverse blade fairing that extends from the at least one arm section.

4. The system of claim 1, wherein the first convex path extends from the bridge center section to the cutout outer edge.

5. The system of claim 1, wherein the trailing arm edge follows a concave path that extends from the bridge center section to the cutout outer edge.

6. The system of claim 1, wherein the majority of rotational positions of the fan includes at least 75 percent of rotational positions of the fan.

7. The system of claim 1, wherein the angle is approximately 90 degrees.

8. The system of claim 1, wherein the angle is between 83 degrees and 97 degrees.

9. The system of claim 1, wherein the bridge center section is circular shaped.

10. The system of claim 1, wherein the bridge center section is substantially aligned with the fan center section.

11. The system of claim 1, wherein the bridge has a plurality of arm sections, each arm section of the plurality of arm sections having an equivalent shape to the at least one arm section.

12. The system of claim 1, wherein the at least one arm section includes two arm sections that extend from opposite sides of the bridge center section.

13. The system of claim 1, wherein the at least one arm section includes three or more arm sections.

14. The system of claim 1, further comprising a reverse blade fairing that is an addition and separate from the at least one arm section.

15. A system for providing streamlined airflow in a server chassis, comprising:
    a fan comprising a plurality of fan blades and configured to rotate in a fan direction, each of the fan blades having a leading fan edge and a trailing fan edge, the leading fan edge extending from a fan center portion of the fan to a fan outer edge, the trailing fan edge opposing the leading fan edge and extending from the fan center portion to the fan outer edge, wherein the fan is an axial-flow fan comprising an airflow inlet that is axially aligned with an airflow outlet; and
    a printed circuit board (PCB) located downstream of the fan and including a cutout for passing of airflow from the fan, the cutout having a cutout edge, the PCB further including a bridge spanning the cutout, the bridge having
       a bridge center section; and
       at least one arm section extending from the bridge center section to a cutout outer edge along a curved path offset towards the fan direction, the at least one arm section having a leading arm edge and a trailing arm edge, the leading arm edge extending from the bridge center section to the cutout outer edge, the trailing arm edge extending from the bridge center section to the cutout outer edge;
    wherein the leading arm edge follows a first convex path that curves towards the trailing fan edge, the trailing fan edge facing against the fan direction and following a second convex path that curves away from the leading arm edge, an angular relationship between the leading arm edge and the trailing fan edge being defined by an angle of intersection between a first tangent line and a second tangent line, the angle of intersection being in a range between 75 degrees and 105 degrees for a majority of rotational positions of the fan, the first tangent line extending along the leading arm edge and touching the leading arm edge at a first point on the leading arm edge, the second tangent line extending along the trailing fan edge and touching the trailing fan edge at a second point on the trailing fan edge, the trailing fan edge extending from a radially inner end to a radially outer end, the second point being a point on the second convex path relative to the trailing fan edge in a two-dimensional plane in which the second convex path extends, the first point being a point on the first convex path relative to the leading arm edge in the two-dimensional plane.

16. The system of claim 15, wherein the angle is approximately 90 degrees.

\* \* \* \* \*